United States Patent [19]

Ahmed et al.

[11] Patent Number: 5,191,213
[45] Date of Patent: Mar. 2, 1993

[54] INTEGRATED CIRCUIT STRUCTURE ANALYSIS

[75] Inventors: Haroon Ahmed; Simon Blythe, both of Cambridge, United Kingdom; Beatrice Fraboni, Bologna, Italy

[73] Assignee: Olivetti Systems & Networks S.r.l., Ivrea, Italy

[21] Appl. No.: 725,303

[22] Filed: Jul. 5, 1991

[30] Foreign Application Priority Data

Jul. 5, 1990 [GB] United Kingdom ......... 9014923

[51] Int. Cl.[5] ............... H01J 37/28; H01J 37/30
[52] U.S. Cl. ................... 250/310; 250/307; 250/397
[58] Field of Search ............ 250/310, 307, 397

[56] References Cited

U.S. PATENT DOCUMENTS

| | | | |
|---|---|---|---|
| 4,438,332 | 3/1984 | Lichtenegger | 250/310 |
| 4,566,937 | 1/1986 | Pitts | 250/492.2 |
| 4,646,253 | 2/1987 | Rehme et al. | 250/310 |
| 4,712,057 | 12/1987 | Pau | 250/310 |
| 4,755,748 | 7/1988 | Lin | 250/310 |
| 4,794,646 | 12/1988 | Takeuchi et al. | 250/306 |
| 4,871,911 | 10/1989 | Van Gorkom et al. | 250/310 |
| 4,933,565 | 6/1990 | Yamaguchi et al. | 250/309 |

Primary Examiner—Bruce C. Anderson
Attorney, Agent, or Firm—Banner, Birch, McKie & Beckett

[57] ABSTRACT

The structure of a multilayered integrated circuit is determined by removing successive layers of the circuit. Following removal of each layer, the revealed surface is scanned by an electron beam. The intensity of backscattered or secondary electrons is detected by a first or second detector respectively. From the detected electron intensities, image processing circuitry derives a representation of the integrated circuit surface scanned. Where the surface of the integrated circuit is a flat layer of semiconductor substrate material having implanted doped areas, the surface is covered with a metallisation layer providing a Schottky barrier junction with the doped areas. Electron beam scanning of the metallisation layer induces a current at this junction which is monitored and processed to derive a representation of the outline of the doped implanted areas.

64 Claims, 5 Drawing Sheets

INTEGRATED CIRCUIT STRUCTURE ANALYSIS

FIELD OF THE INVENTION

The present invention relates to methods and apparatus for determining the structure of a multilayer semiconductor integrated circuit.

BACKGROUND TO THE INVENTION

There is a need for a process by which the structure of a multilayered semiconductor integrated circuit may be found. Current techniques provide only partial information or are excessively time consuming to operate.

One known device which may be used to inspect the surface of a body of semiconductor material is described in U.S. Pat. No. 4,438,332 (Lichtenegger). The Lichtenegger device comprises a scanning electron microscope having an electron beam source, means for focussing the electron beam and for controllably scanning the electron beam over the surface of a body of semiconductor material, a first detector responsive to backscattered electrons from the scanned surface, and processing means operable to derive a representation of the scanned surface from signals received from the first detector. The Lichtenegger device further comprises a number of secondary detectors responsive to secondary electrons emitted by the scanned surface, with the processing means being connectable to receive a signal from any of the secondary detectors.

SUMMARY OF THE INVENTION

It is an object of the present invention to provide a method and apparatus for determining the structure of an integrated circuit.

It is also an object of the present invention to provide a method for removing selected features from a layer of an integrated circuit.

It is a further object of the present invention to provide a method of determining the location, in a surface of a body of semiconductor material, of at least one region of the body having a higher dopant concentration than a contiguous portion of the body.

It is yet a further object of the present invention to provide, in an integrated circuit manufacturing process where the circuits are built up in layers, a method of monitoring construction.

The method of determining the structure of an integrated circuit involves scanning a surface of the integrated circuit with an electron beam and detecting backscattered electrons from the scanned surface or secondary electrons emitted by the scanned surface. A representation of the scanned surface is then derived from the detected electrons and stored. Following the derivation, a layer of predetermined thickness is removed from the scanned surface, and the steps of scanning, detection and derivation are repeated at least once.

The apparatus provided for determining the structure of an integrated circuit comprises an electron beam source together with means for focussing the electron beam and for controllably scanning it over a surface of the integrated circuit. The apparatus further comprises three detectors, namely a first detector responsive to backscattered electrons from the scanned surface of the integrated circuit, a second detector responsive to secondary electrons emitted by the scanned surface, and a third detector comprising a metallisation layer deposited on the surface of a body of semiconductor material of the integrated circuit and forming a Schottky barrier junction with at least one region of the body having a higher dopant concentration than a contiguous portion of the body. Current sensing means are provided for the third detector for sensing the current arising from the Schottky barrier junction or junctions as the focussed electron beam scans the metallisation layer. Processing means operable to derive a representation of the scanned surface from signals from the first, second or third detector are provided.

The method for removing selected features from a layer of an integrated circuit involves scanning a surface of the said layer with an electron beam; detecting backscattered electrons from the scanned surface or secondary electrons emitted by the scanned surface; deriving a representation of the selected features of the scanned surface from the detected electrons; and storing the derived representation. Following these steps the surface is covered with a layer of etch resistant material which is developed with the selected features of the scanned surface from the derived and stored representation. The etch resistant material covering the selected features of the scanned surface is then removed and the selected features of the scanned surface are etched away.

The method of determining the location, in a surface of a body of semiconductor material, of at least one region of the body having a higher dopant concentration than a contiguous portion of the body, involves depositing a metallisation layer on the said surface so as to form a Schottky barrier junction with a least the said one region. Following deposition the metallisation layer is controllably scanned with a focussed electron beam and the current arising from the Schottky barrier junction or junctions as the beam scans the metallisation layer is sensed.

The method of monitoring construction in an integrated circuit manufacturing process where the circuits are built up in layers involves scanning a layer with an electron beam and detecting backscattered electrons from the scanned surface or secondary electrons emitted by the scanned surface. A representation of the features of the scanned surface from the detected electrons is then derived and compared with a stored representation of the expected features of the scanned surface.

These and other aspects of the present invention, together with preferred embodiments thereof, are described in greater detail hereinafter and in the claims attached hereto to which reference should now be made.

BRIEF DESCRIPTION OF THE INVENTION

The invention will now be described by way of example only, and with reference to the accompanying drawings in which:

FIG. 1 schematically illustrates electron beam scanning and measurement apparatus according to present invention;

DETAILED DESCRIPTION OF PREFERRED EMBODIMENTS

Figure 1:
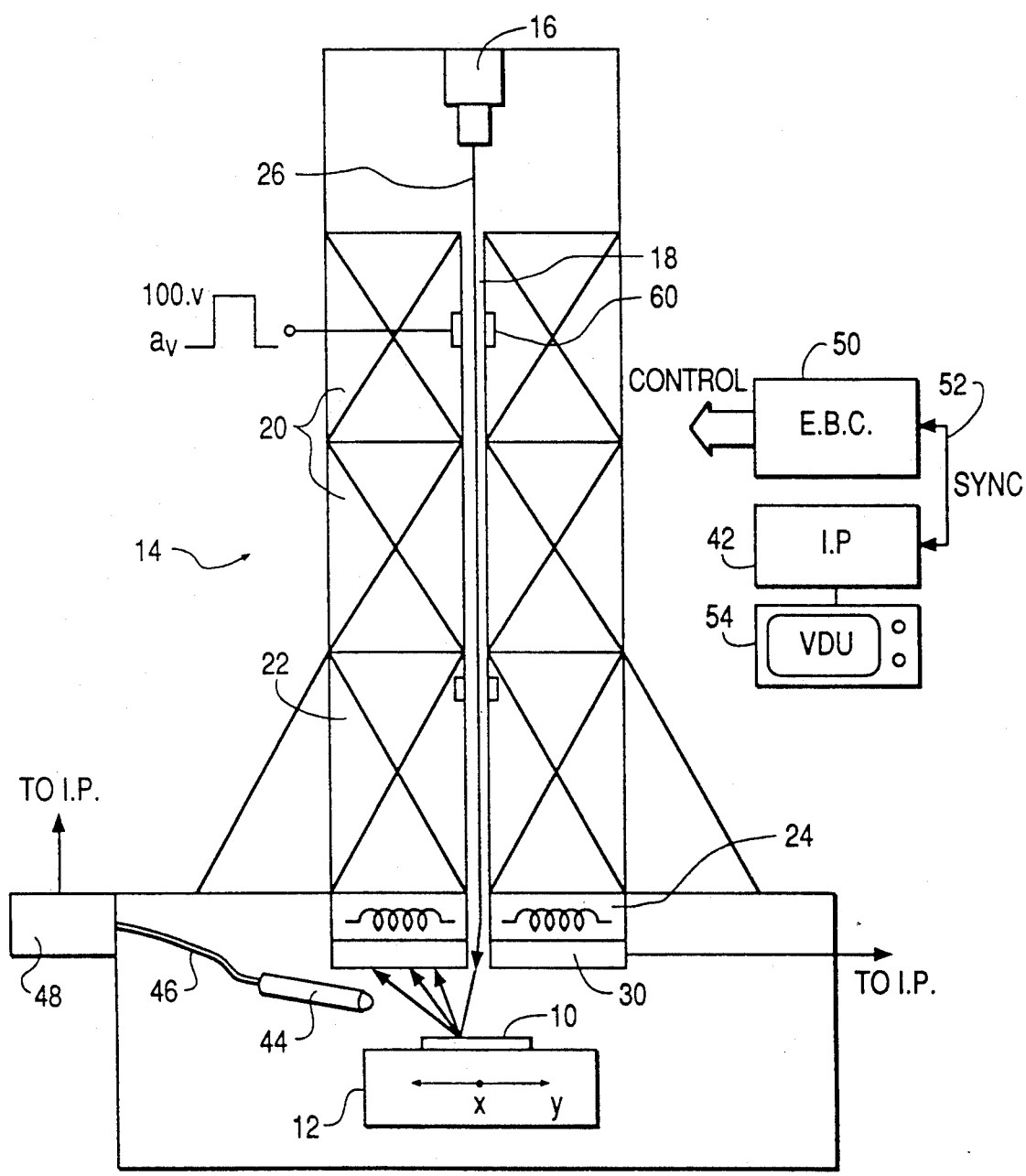
Figure 2:
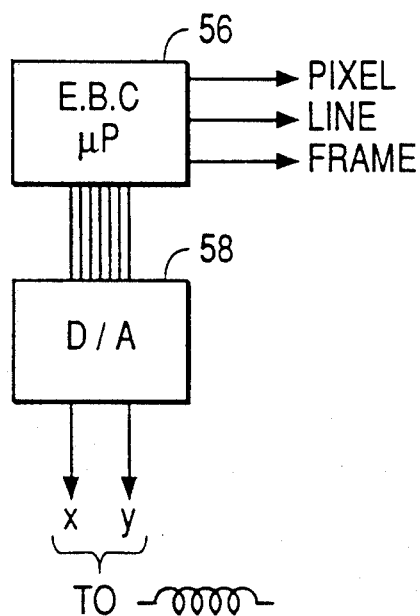
FIG. 2 represents a portion of the control circuitry of the apparatus of FIG. 1.

Referring initially to FIG. 1 an integrated circuit 10 to be analysed is mounted on a table 12 below an electron beam gun assembly 14. The table 12 is movable in two mutually perpendicular directions x,y, each perpendicular to the direction of an incident electron beam from the electron beam gun assembly 14. Movement of the table in the mutually perpendicular directions x,y may be achieved by stepper motors and lead screws in a conventional manner.

The electron beam gun assembly 14 comprises a gun 16, suitably a heated lanthanum hexaboride element generating an electron beam. The beam passes through a tunnel 18 around which are two sets of condenser coils 20 and an objective coil 22 as can be seen from FIG. 1. The table 12, objective coil 22, condenser coils 20, and gun 16 are in vertical alignment.

Figure 4:
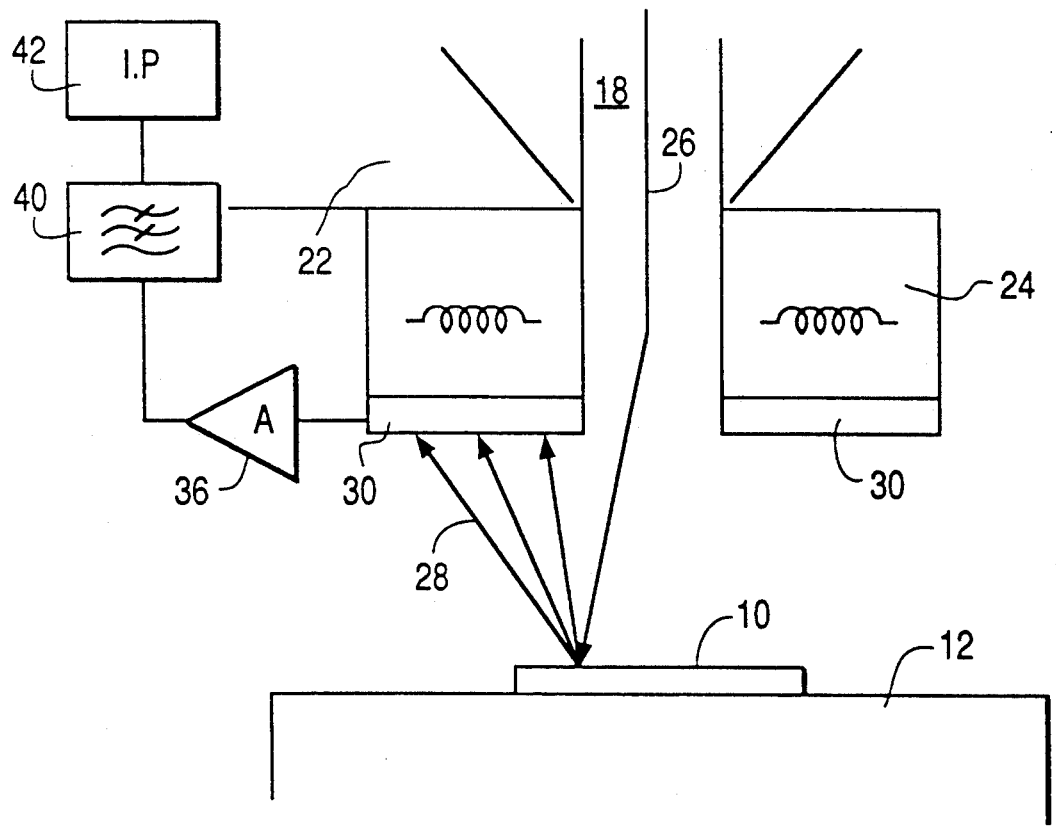
FIG. 4 is an enlarged detail of a portion of FIG. 1 showing deflection and detection of an electron beam.

Below the objective coil 22 is a set of four deflector coils 24 (two orthogonal pairs) which, as shown in FIG. 4, can direct the electron beam 26 such that it strikes the integrated circuit 10 at a predetermined position.

It will be appreciated that the electron beam gun assembly 14 is as for an electron beam lithography machine. Differences will be apparent from the following description.

Figure 3:
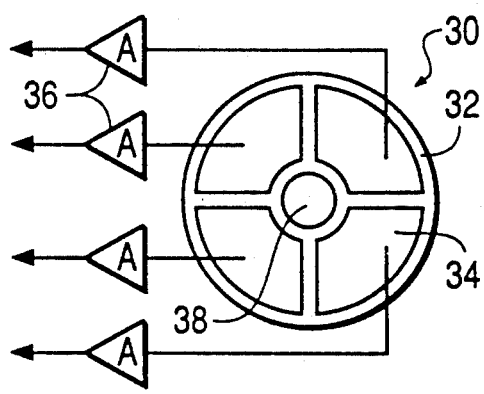
FIG. 3 shows a backscattered electron detector used in the apparatus of FIG. 1.

Backscattered electrons 28, reflected from the top surface of the integrated circuit 10, are detected by a first detector 30 mounted below the deflection coils 24. The first detector 30, shown in greater detail in FIG. 3, is an annular body 32 having four quadrants 34, each of which is a thin p-n junction diode. The output from each of the diodes 34 is current amplified by an amplifier 36 before being low pass filtered 40 following which it is fed to image processing circuitry 42. The aperture 38 in the centre of the first detector is positioned such that the electron beam 26 passes through it on the way to the integrated circuit 10.

A second detector 44 is positioned adjacent the integrated circuit and detects secondary electrons: secondary electrons are those emitted by the integrated circuit as a result of excitation of the surface thereof by the electron beam 26. The secondary detector 44 is a scintilator which generates light when struck by the secondary electrons. The generated light is passed along a light pipe 46 to a photomultiplier tube 48 where it is converted to an electrical signal which signal is then fed to the image processing circuitry 42.

Control of the electron beam gun apparatus 14 is by an electron beam control unit EBC 50. The electron beam control unit 50 is connected to the image processing circuitry 42 by a synchronising line 52. The output CONTROL from the electron beam controlling circuitry 50 controls the condenser and objective coils 20, 22, the deflection coils 24 and the gun 16.

The output from the image processing circuitry 42, including derived representations to be described in greater detail hereinafter, is displayed on a suitable display device such as a cathode ray tube 54. The circuitry 42 includes or is coupled to data storage means.

Figure 5:
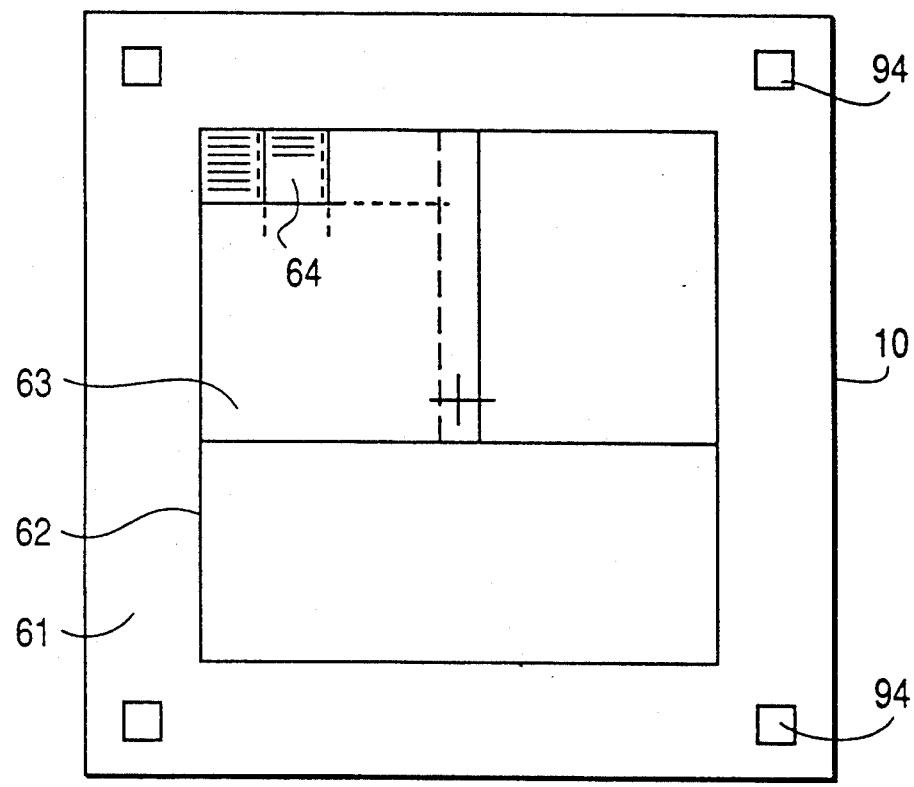
FIG. 5 is a schematic plan view of a body of semiconductor material scanned by the apparatus of the present invention.

The operation of scanning an integrated circuit will now be described with particular reference to FIGS. 1, 2, 4, 5 and 6. A microprocessor unit 56 in the electron beam control circuitry 50 generates positional control signals which, after passing through a digital to analog converter 58, are fed to the deflection coils 24. By selectively energizing the deflector coils 24, the electron beam 26 can be caused to scan the surface of the integrated circuit 10. The surface of the integrated circuit 10 is preferably raster scanned in a single direction only with the electron beam 26 being stopped or blanked during fly back. Blanking of the electron beam 26 is achieved by a applying a high voltage potential, typically 100 volts, to a pair of plates 60 at either side of the electron beam gun assembly 14 central passage 18. As shown in FIG. 5, the surface of the integrated circuit 10 is divided into an area of interest 62 which it is desired to scan and an outer portion 61 where there is either no circuitry is of known configuration which it is not desired to test. The area of interest 62 is divided into frames 64, each overlapping slightly with adjacent frames, and the frames 64 are raster scanned sequentially. Control signals PIXEL, LINE, FRAME from the electron beam controller microprocessor 56 instantaneously locate the position of the electron beam with respect to the surface of the integrated circuit 10. These signals PIXEL, LINE, FRAME are fed to the image processing circuitry 42 via the control line SYNC. The image processing circuitry then builds up a record of the detected electron intensity, from either the first 30 or second 44 detectors over the whole of the area of interest 62 of the surface of the integrated circuit 10 from which a representation of the surface of the integrated circuit 10 is derived. The size of each frame 64, the number of scans per frame, and the number of pixels per scan is selected in dependence on the required detail of the derived representation.

With maximum deflection of the electron beam 26, an area of 6 mm by 6 mm can be scanned, although at the outer edges of this scanned area slight distortion occurs. A 6 mm square will cover most currently known gate arrays.

Where it is desired to scan an area greater than a 6 mm square, or to avoid the edge distortion for such a square, the area of interest 62 is divided into a number of overlapping fields 63, each field covering a 4 mm square of integrated circuit surface area. As before each of the fields 63 is scanned a frame at a time to build up a derived representation of that field. Controlled movement of the table 12 supporting the integrated circuit 10 brings successive fields 63 into position below the electron beam gun assembly 14.

When deriving a representation of a scanned area, the image processing circuitry 42 builds up a histogram of detected electron intensity levels over the scanned surface. A threshold level is set and, when displaying the representation, any pixel with a detected intensity above the threshold is shown black (representing "solid" items such as metal tracks) and any pixel with a detected intensity below the threshold level is shown white. Careful setting of the threshold level is required to provide maximum detail whilst minimising spurious results, which may be due to dirt on the scanned surface or reflections from features below the surface. At this stage, further image processing techniques may be used to provide a clearer image.

Once the threshold level has been set, the pixel values are binarised, that it is to say each is assigned a value of 1 or 0 to indicate whether it is to be displayed in black or white.

Figure 6:
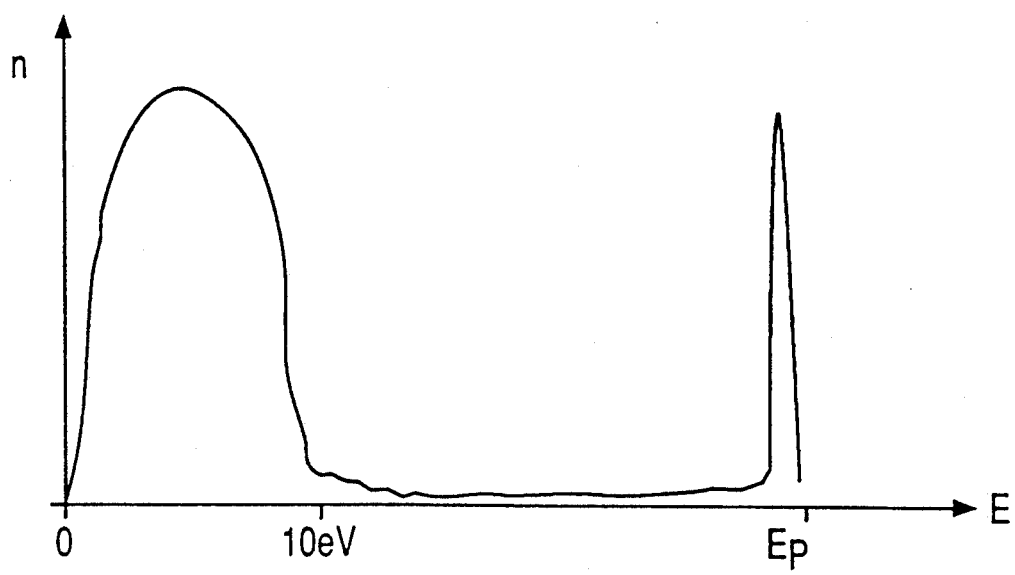
FIG. 6 is a graph showing detected electron intensity at increasing electron energy.

The power of the electron beam 26 is reduced when scanning non-metallic areas. As shown in FIG. 6, which is a graph of detected electron intensity n against electron energy E there are a large number of low energy secondary electrons, released by the surface of the integrated circuit due to excitation by the incident electron beam, up to around 10 electron volts. Detected electron intensity is then negligible with increasing energy until a peak occurs at the level of primary beam energy $E_p$ which represents the backscattered electrons which are reflected from the surface of the integrated circuit rather than being released therefrom. The first and second detectors are thus required to allow detection of both the low energy secondary electrons and the high energy backscattered electrons.

Figure 7:
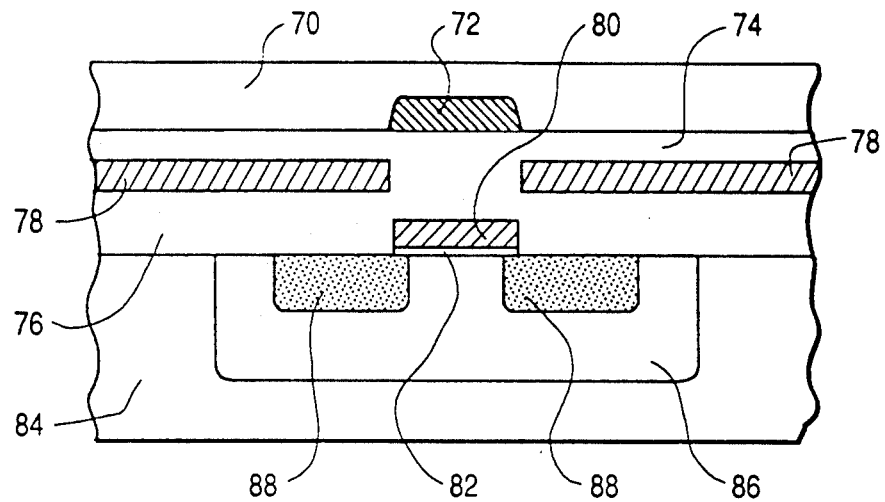
FIGS. 7 to 12 show successive stages in a method of integrated circuit structure analysis in accordance with the present invention.

The operation of the apparatus described, to analyse the structure of an integrated circuit, will now be described with particular reference to FIGS. 7 to 12. Referring initially to FIG. 7, a sectional elevation through a typical two level silicon integrated circuit is shown. From the top downwards the integrated circuit comprises respectively a passivation layer 70 of silicon dioxide or silicon nitride, an upper aluminium conductor 72, layers 74, 76 of silicon dioxide insulator surrounding a lower set of aluminium conductors 78, a polysilicon gate contact 80 on a layer of gate oxide 82 and a layer of semiconductor substrate material 84. A well 86 of p- or n-type doped material is implanted in the silicon substrate below the polysilicon gate contact 80. Implanted in the p- or n-type implant are source and drain implants 88 adjacent the polysilicon gate contact 80.

Figure 8:
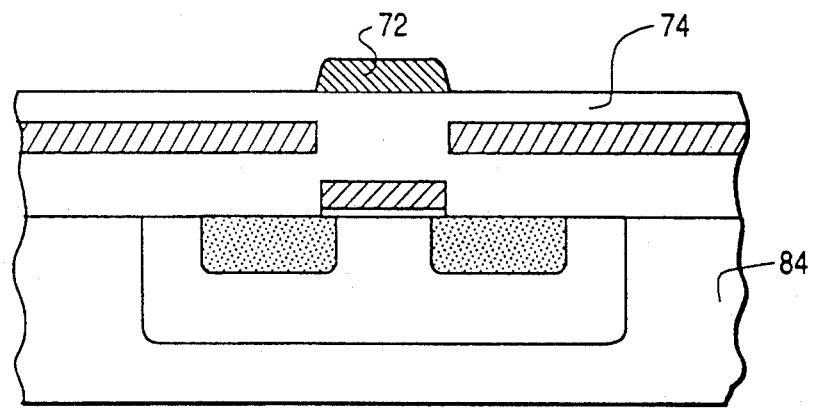

The first stage in the process is the removal of the passivation layer 70 as shown in FIG. 8. This layer is removed by dry etching—a known technique whereby the surface to be etched is subjected to a corrosive gas plasma which eats away the surface material. Different gas plasma mixtures are required for different substances, and in the case of the passivation layer of silicon dioxide or silicon nitrite a mixture of carbon tetrafluoride and oxygen is used.

When, as shown in FIG. 8, the passivation layer 70 has been removed to reveal the upper aluminium conductor 72 the surface of the integrated circuit is scanned by the electron beam gun assembly described herein above and a representation of the surface, showing the upper aluminium conductor 72 is produced and stored by the image processing circuitry 42.

Figure 9:
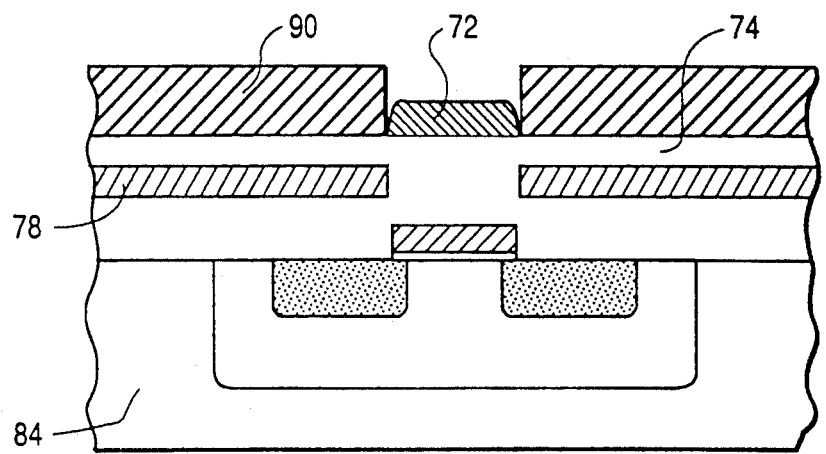

The next stage is the removal of the upper aluminium conductor 72 which is again accomplished by dry etching, this time using silicon tetrachloride as the gas plasma (the chlorine ions of which attack the aluminium surface). To avoid degradation of the oxide insulator layer 74 around and below the upper aluminium conductor 72 there is provided a process of protective lithography whereby only the aluminium conductor 72 will be etched. In this process, described with particular reference to FIG. 9, the upper surface of the integrated circuit including the upper aluminium conductor 72 is covered with a layer of etch resistant material 90. This layer of etch resistant material 90 is then developed with the selected features of the scanned surface (in this instance the upper aluminium conductor 72). The pattern and a location of selected features is taken from the derived representation stored by the image processing circuitry following scanning of the upper surface of the integrated circuit with the passivation layer removed. Following development of the layer of etch resistant material, the etch resistant material covering the selected feature or features is removed as shown in FIG. 9, following which the dry etching process is used to remove the selected feature (the upper aluminium conductor 72). The etch resistant material 90 can then be removed.

When etching an aluminium feature more than one layer deep, the silicon tetrachloride plasma is removed, when one layer depth of aluminium has been removed, and briefly replaced by a carbon tetrafluoride and oxygen mixture plasma. This mixture passivates the surface of the remaining aluminium and protects it from any residual chlorine ions which would otherwise combine with atmospheric water vapour to form hydrochloric acid which would continue to etch the surface of the aluminium. The mixture is preferably in the ratio of 90% carbon tetrafluoride to 10% oxygen.

Figure 10:
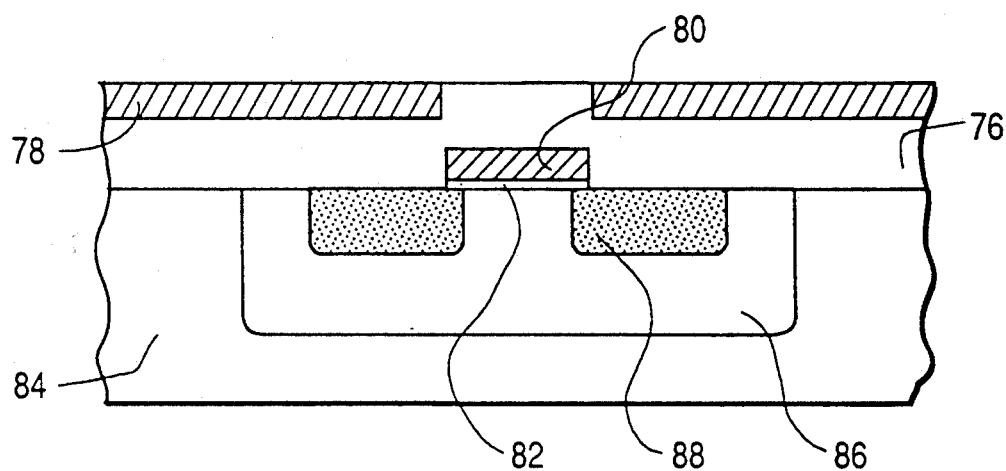

Following scanning by the electron beam apparatus to derive and store a representation of the surface with the aluminium conductor removed, the upper layer 74 of oxide insulator is removed by dry etching with a mixture of carbon tetrafluoride and oxygen to reveal the lower aluminium conductors 78, as shown in FIG. 10.

Figure 11:
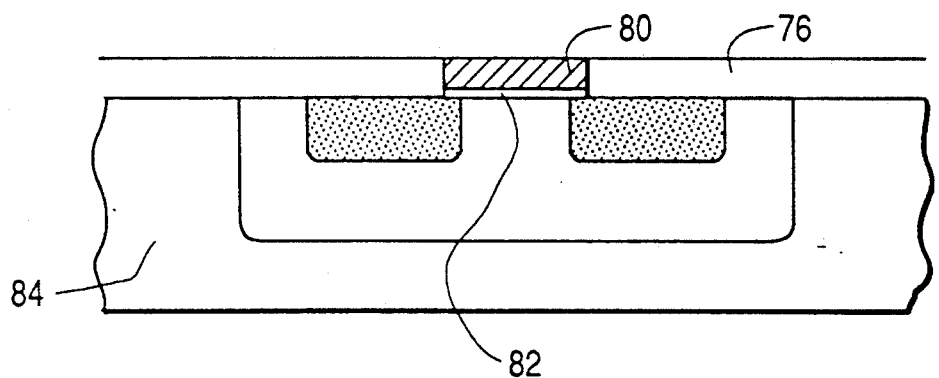
Figure 12:
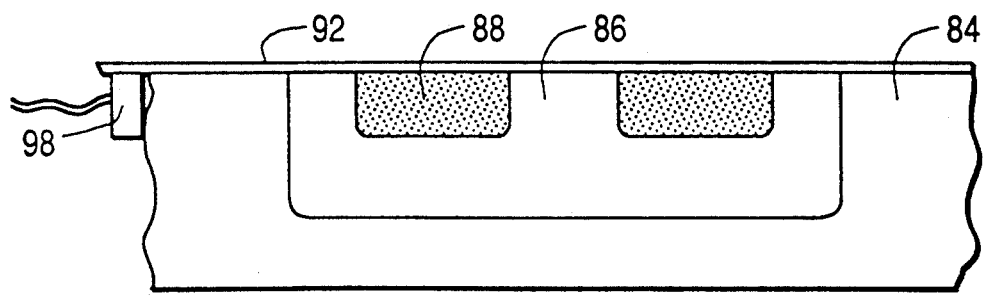

Following further scanning, derivation and storing of representations, and dry etching of the lower aluminium conductors 78 (again using the protective lithography described above) a layer of the oxide insulator 76 is removed leaving a polysilicon gate contact 80 on a layer of gate oxide 82 on the substrate 84 surrounded by insulating oxide, as shown in FIG. 11. This layer is then scanned. To remove the polysilicon gate contact 80 and the remainder of the insulating oxide 76, the surface of the integrated circuit is washed with hydrofluoric acid which dissolves the insulating oxide 76 and the layer of gate oxide 82 beneath the gate contact 80 allowing it to be "floated" off.

Further scanning of the substrate surface does not provide a useful indication of the position of implanted doped regions. As will now be described with reference to FIG. 12, there is provided a method by which such doped regions may be delineated.

Once the upper layers of passivation, oxide, aluminium etc. have been removed from a substrate a metallisation layer 92 is deposited on the surface of the substrate, covering the entire upper surface of the substrate but making no connection to the lateral side walls of the substrate. Depending on the metal used for the metallisation layer 92, the layer will form a Schottky barrier junction with n- or p- type doped regions, depending on the work function of the metal and on the electron infinity of the semiconductor substrate material. The metallisation layer preferably has a minimum thickness of 20 nanometers and is preferably of aluminium where the doped region is n-type doped, or gold where it is p-type doped. Separate electrical connections are made to each of the metallisation layer 92 and the substrate 84, with the substrate connection being held at ground potential.

Making of the electrical connection, by attachment of an electrical contact 98 to the metallisation layer, is achieved by locating the contact 98 adjacent the substrate 84 such that, when the metallisation layer 92 is deposited, it extends to connect with the contact 98.

The contact may be a wire one end of which is connected to the surface of the metallisation layer.

The metallisation layer 92 acts as a third detector in addition to the pn diode 30 and scintillator 44. When the surface of the metallisation layer 92 is scanned by the electron beam, a current is induced at the Schottky barrier junction, with electrons and holes generated at the junction being swept either to the metallisation layer or to the substrate by the resultant field. The signal taken from the contact to the metallisation layer is fed to a current amplifier which produces an output of a high enough voltage to drive further signal processing stages. The variation in electron beam induced current indicates the concentration of implanted material below the metallisation layer at that point. Because most, if not all, of the substrate will be doped to some extent, thresholding and other image enhancement techniques are required to minimise spurious information.

The metallisation technique is used twice, once with a layer of gold, and once with a layer of aluminium to test for both p-type and n-type implanted regions. If necessary, a gold layer metallisation can be removed by applying a mixture of concentrated nitric and hydrochloric acids.

It will be appreciated that, in order to build up an accurate three dimensional picture of the integrated circuit structure, it is necessary to know the depths and relative spacings of the layers of passivation, oxide, aluminium etc. To achieve this, known techniques of vertical sectioning are used to monitor the depth of each layer and control the amount of material removed during each etching operation. Such vertical sections are preferably taken at the edge of an integrated circuit or in a portion of the circuitry which is not desired to accurately analyse.

During scanning, additional information may be obtained by electrically activating the circuits of the integrated circuit or at least the remaining parts thereof. Establishing electrical connection to parts of the integrated circuit may be achieved in a number of known ways.

During structural analysis of the integrated circuit, it may be necessary to remove it from the table 12 at an intermediate stage in the process, for example to deposit a layer of etch resistant material during the protective lithography stage as described herein above. Accurate relocation of the integrated circuit is vital to ensure accurate alignment of derived representations from successive layers.

The technique by which registration of successive representations is obtained is as follows. At least a portion of the representation derived and stored prior to removal of the integrated circuit 10 includes a reference portion: this reference portion locates the derived representation for the layer prior to removal (the first layer) with respect to either the derived representation for the next layer if a layer is removed, or with respect to the same (first) layer following deposition of etch resistant material on that layer. The reference portion may comprise a selected feature of the first layer which also occurs at the same position in the next layer or may comprise a selected feature of the next layer which may be detected prior to removal of the first layer. As shown in FIG. 5, the reference portion may comprise a square (94) on the surface of the integrated circuit in the outer region 61 thereof, outside the area of interest 62 which is being scanned. Alternatively, the reference portion may be a part of the circuitry within the area of interest the construction and location of which is already accurately known.

In the case where an integrated circuit has been removed, covered with etch resistant material, and replaced, the technique used for registration of images and hence successful relocation of the integrated circuit, depends on the level of contrast of the surface features below the etch resistant material and the nature of the image (the derived representation for that layer prior to administration of the etch resistant material). Following replacement, the surface of the etch resistant material is scanned. If the original image does not contain highly periodic features, software is used to cross correlate the derived representation obtained through the etch resistant material with the original image derived prior to removal of the integrated circuit. The result of cross correlation is fed back into registration software in the image processing circuitry which produces the necessary correction values which are to be applied to further scans.

If the original image does contain highly periodic features, such that cross correlation software cannot be used, registration is effected manually. A cursor is used to "measure" (i.e. determine positional coordinates of) a reference point on the original image and the adjustments needed to bring the same feature to this position in the scanned image of features visible through the resist. Suitably, the original image and the image of features visible through the resist are displayed on a screen at the same time, to allow the operator to check the correction.

This relocation technique is also useful in cases where it is desired to remove the integrated circuit between scans to check the progress of etching.

It will be appreciated that the technique of layer by layer scanning with an electron beam may be used in "reverse", that is to say in a manufacturing process where integrated circuits are built up in layers in which each layer formed is scanned with an electron beam and backscattered or secondary electrons are detected such that a representation of the features of the scanned surface may be derived and compared with a stored representation of the expected features of such a surface. The techniques of metallisation layer deposition to detect implanted doped areas in a semiconductor substrate, and of relocation of a removed integrated circuit are also applicable to this process.

What we claim is:

1. Apparatus for determining the structure of an integrated circuit of the type comprising different layers, including metallic and non-metallic features, and a body including at least one region with a higher type-p or type-n dopant concentration with respect to adjacent regions, said apparatus comprising:

an electron beam source;

means for focussing an electron beam from said source and for controllably scanning said electron beam over a surface of said integrated circuit;

a first detector responsive to backscattered electrons from the surface of said integrated circuit to represent said metallic features;

a second detector responsive to secondary electrons emitted by said surface to represent said non-metallic features; and processing means coupled to each of said first and second detectors and operable to derive a representation of said metallic and non-metallic features of said layers from signals from said first and second detectors;

the improvement comprising means for representing said one region with the higher type-p or type-n dopant concentration as induced at a Schottky barrier junction in said one region. said means comprising:

a third detector connected with a metallisation layer of one of a first type of metal or a second type of metal to define the Schottky barrier junction with said region with respecitve ones of the higher type-p dopant concentration or type-n dopant concentration, and current sensing means connected with said third detector for sensing a current arising from said Schottky barrier junction as said electron beam scans said metallisation layer; and wherein said processing means are also coupled to said third detector and are operable to derive a representation of said at least one region with the higher type-p doped or type-n doped concentration from signals from said third detector.

2. The invention set forth in claim 1, wherein said first detector is a thin p-n junction diode.

3. The invention set forth in claim 1, wherein said first detector is an annular assembly comprising four quadrants, each of said quadrants being a separate p-n junction diode, said first detector being positioned such that said focussed electron beam passes through said aperture therein.

4. The invention set forth in claim 1, including means for controllably moving said integrated circuit relative to said electron beam source.

5. The invention set forth in claim 4, wherein said means for controllably moving said integrated circuit comprise a pair of stepper motor and lead screw assemblies arranged to move said integrated circuit in either of two mutually perpendicular directions in a plane perpendicular to said electron beam from said electron beam source.

6. The invention set forth in claim 1, including means for removing selected features from a layer of said integrated circuit.

7. The invention set forth in claim 6, wherein said means for removing selected features comprise a source of gas plasma and means for applying said gas plasma to said selected feature.

8. The invention set forth in claim 1, wherein said metallisation layer is of a material sealected from the group comprising gold, aluminium, titanium, and paladium.

9. The invention set forth in claim 1, including means operable to display at least one said derived representation.

10. The apparatus set forth in claim 1 for representing features of an integrated circuit, wherein said first type of metal is gold and wherein said one region includes a higher concentration of p-type dopant.

11. The apparatus set forth in claim 1 for representing features of an integrated circuit, wherein said first type of metal is aluminum and wherein said one region includes a higher concentration of n-type dopant.

12. The apparatus set forth in claim 1 for representing features of an integrated circuit wherein said metallisation layer has a minimum thickness of 20 nanometers.

13. A method of determining the structure of an integrated circuit, including the steps of:

a) scanning a surface of said integrated circuit with an electron beam;

b) detecting electrons, said electrons being selected from the group comprising backscattered electrons from said scanned surface and secondary electrons emitted by said scanned surface;

c) deriving a representation of said scanned surface from said detected electrons;

d) removing a layer of predetermined thickness from said scanned surface;

e) repeating steps a) to c) at least once; and f) storing at least a part of each said derived representation.

14. The invention set forth in claim 13, wherein said stored part of a derived representation for a first layer includes a reference portion, and wherein said reference portion locates said derived representation for said first layer with respect to a derived representation for a next layer.

15. The invention set forth in claim 14, wherein said reference portion comprises at least one selected feature of said first layer which also occurs at the same position in said next layer.

16. The invention set forth in claim 14, wherein said reference portion comprises at least one selected feature of said next layer which may be detected prior to removal of said first layer.

17. The invention set forth in claim 13, wherein, when said integrated circuit includes a passivation layer of silicon dioxide or silicon nitrate, said passivation layer is removed by dry etching with a mixture of carbon tetrafluoride and oxygen.

18. The invention set forth in claim 13, wherein removal of aluminium layers of or aluminium features of layers is achieved by dry etching with silicon tetrachloride.

19. The invention set forth in claim 18, wherein, following said etching by silicon tetrachloride, a mixture of carbon tetrafluoride and oxygen is applied to passivate the aluminium.

20. The invention set forth in claim 19, wherein said mixture is 90% carbon tetrafluoride and 10% oxygen.

21. The invention set forth in claim 13, wherein removal of polysilicon layers or features of layers is achieved by etching beneath them with hydrofluoric acid.

22. The invention set forth in claim 13, wherein removal of gold layers or gold features of layers is achieved by inert gas bombardment.

23. The invention set forth in claim 22, wherein said inert gas is argon.

24. The invention set forth in claim 13, wherein said step of scanning said surface with a focussed electron beam comprises dividing said surface into separate areas and raster scanning successive ones of said separate areas.

25. The invention set forth in claim 13, including the step of image processing of said derived representation wherein the intensity of said detected electrons for each point on said scanned surface is compared with a threshold value and each such point is assigned a first or second value in dependence on whether said intensity is greater or less than said threshold value.

26. The invention set forth in claim 25, including the step of displaying said derived representation wherein said displayed points are black or white depending on whether they have been assigned said first or second value.

27. The invention set forth in claim 13, wherein, when there are surface features of interest which are metal, said representation is derived from said detected backscattered electrons.

28. The invention set forth in claim 13, wherein, when there are surface features of interest which are non-metallic, said representation is derived from said detected secondary electrons.

29. The invention set forth in claim 13, including the step of reducing the power of said focussed electron beam when said scanned surface is non-metallic.

30. A method for removing selected features from a layer of an integrated circuit comprising the steps of:
   scanning a surface of said layer with an electron beam;
   detecting electrons, said electrons being selected from the group comprising backscattered electrons from said scanned surface and secondary electrons emitted by said scanned surface;
   deriving a representation of said selected features of said scanned surface from said detected electrons;
   storing said derived representation;
   covering said surface with a layer of etch resistant material;
   developing said layer of etch resistant material with said selected features of the scanned surface from said derived and stored representation;
   removing said etch resistant material covering said selected features of said scanned surface; and
   etching away said selected features of said scanned surface.

31. The invention set forth in claim 30, wherein, when said integrated circuit includes a passivation layer of silicon dioxide or silicon nitrate, said passivation layer is removed by dry etching with a mixture of carbon tetrafluoride and oxygen.

32. The invention set forth in claim 30, wherein removal of aluminium layers of or aluminium features of layers is achieved by dry etching with silicon tetrachloride.

33. The invention set forth in claim 32, wherein, following said etching by silicon tetrachloride, a mixture of carbon tetrafluoride and oxygen is applied to passivate the aluminium.

34. The invention set forth in claim 33, wherein said mixture is 90% carbon tetrafluoride and 10% oxygen.

35. The invention set forth in claim 30, wherein removal of polysilicon layers or features of layers is achieved by etching beneath them with hydrofluoric acid.

36. The invention set forth in claim 30, wherein removal of gold layers or gold features of layers is achieved by inert gas bombardment.

37. The invention set forth in claim 36, wherein said inert gas is argon.

38. The invention set forth in claim 30, wherein said step of scanning said surface with a focussed electron beam comprises dividing said surface into separate areas and raster scanning successive ones of said separate areas.

39. The invention set forth in claim 30, including the step of image processing of said derived representation wherein the intensity of said detected electrons for each point on said scanned surface is compared with a threshold value and each such point is assigned a first or second value in dependence on whether said intensity is greater or less than said threshold value.

40. The invention set forth in claim 39, including the step of displaying said derived representation wherein said displayed points are black or white depending on whether they have been assigned said first or said second value.

41. The invention set forth in claim 30, wherein, when there are surface features of interest which are metal, said representation is derived from said detected backscattered electrons.

42. The invention set forth in claim 30, wherein, when there are surface features of interest which are non-metallic, said representation is derived from said detected secondary electrons.

43. The invention set forth in claim 30, including the step of reducing the power of said focussed electron beam when said scanned surface is non-metallic.

44. A method of determining the location, in a surface of a body of semiconductor material, of first and second regions of said body having higher dopant concentration of type-p dopant and type-n dopant, respectively, with respect to contiguous portions of said body, said method comprising the steps of:
   depositing a metallisation layer of a first type on said surface so as to form a first Schottky barrier junction with one of the first and second regions of said body;
   controllably scanning said metallisation layer of a first type with a focussed electron beam;
   sensing the current arising from said first Schottky barrier junction as said beam scans said metallisation layer to represent said one of the first and second regions in said surface;
   removing said metallisation layer of a first type and replacing it with a metallisation layer of a second type so as to form a second Schottky barrier junction with another of the first and second regions of said body;
   controllably scanning said metallisation layer of a second type with a focussed electron beam;
   sensing the current arising from said second Schottky barrier junction as said beam scans said metallisation layer of a second type to represent said other of the first and the second regions in said surface; and
   providing a derived representation of said surface in response to the current arising from said first and second Schottky barriers.

45. The invention set forth in claim 44 including the steps of attaching an electrical contact to each of said metallisation layer and said body.

46. The invention set forth in claim 45 including the step of electrically connecting said body to ground potential.

47. The invention set forth in claim 45 wherein attachment of said electrical contact to said metallisation layer is achieved by locating said contact adjacent said body such that, when said metallisation layer is deposited on said surface, said metallisation layer extends to connect with said contact.

48. The invention set forth in claim 45 wherein said electrical contact to said metallisation layer is a wire, an end of said wire being connected to a surface of said metallisation layer.

49. The invention set forth in claim 44, wherein the material of said metallisation layer is selected from the group comprising gold, aluminium, titanium, and paladium.

50. The invention set forth in claim 44, wherein the depth of said deposited metallisation layer is at least 20 nm.

51. The invention set forth in claim 44, including the step of removing said metallisation layer with a mixture of concentrated nitric and hydrochloric acids.

52. The invention set forth in claim 44, wherein, when said integrated circuit includes a passivation layer of silicon dioxide or silicon nitrate, said passivation layer is removed by dry etching with a mixture of carbon tetrafluoride and oxygen.

53. The invention set forth in claim 44, wherein removal of aluminium layers of or aluminium features of layers is achieved by dry etching with silicon tetrachloride.

54. The invention set forth in claim 53 wherein, following said etching by silicon tetrachloride, a mixture of carbon tetrafluoride and oxygen is applied to passivate the aluminium.

55. The invention set forth in claim 54 wherein said mixture is 90% carbon tetrafluoride and 10% oxygen.

56. the invention set forth in claim 44 wherein removal of polysilicon layers or features of layers is achieved by etching beneath them with hydrofluoric acid.

57. The invention set forth in claim 44 wherein removal of gold layers or gold features of layers is achieved by inert gas bombardment.

58. The invention set forth in claim 57 wherein said inert gas is argon.

59. The invention set forth in claim 44, wherein said step of scanning said surface with a focussed electron beam comprises dividing said surface into separate areas and raster scanning successive ones of said separate areas.

60. The invention set forth in claim 44, including the step of image processing of said derived representation wherein the intensity of said detected electrons for each point on said scanned surface is compared with a threshold value and each such point is assigned a first or second value in dependence on whether said intensity is greater or less than said threshold value.

61. The invention set forth in claim 60, including the step of displaying said derived representation wherein said displayed points are black or white depending on whether they have been assigned said first or said second value.

62. The method set forth in claim 44, wherein said metallisation layer of a first type is gold and wherein said one of the first and second regions of said body includes a higher concentration of p-type dopant.

63. The method set forth in claim 44, wherein said metallisation layer of a second type is aluminum and wherein said other of the first and second regions of said body includes a higher concentration of p-type dopant.

64. The apparatus set forth in claim 44 for representing features of an integrated circuit wherein said metallisation layer has a minimum thickness of 20 nanometers.

* * * * *